United States Patent [19]
Matsui et al.

[11] Patent Number: 4,872,174
[45] Date of Patent: Oct. 3, 1989

[54] SEMICONDUCTOR LASER DEVICE HAVING A GRATING STRUCTURE

[75] Inventors: Sadayoshi Matsui, Tenri; Mototaka Taneya, Tsukuba; Mitsuhiro Matsumoto, Nara; Hiroyuki Hosoba, Tenri; Haruhisa Takiguchi, Nara; Hiroaki Kudo, Tenri, all of Japan

[73] Assignee: Sharp Kabushiki Kaisha, Osaka, Japan

[21] Appl. No.: 239,301

[22] Filed: Sep. 1, 1988

[30] Foreign Application Priority Data

Sep. 2, 1987 [JP] Japan ................ 62-219719

[51] Int. Cl.$^4$ ................ H01S 3/19
[52] U.S. Cl. ................ 372/45; 372/46; 372/96
[58] Field of Search ................ 372/44, 45, 46, 96, 372/48

[56] References Cited

U.S. PATENT DOCUMENTS

| | | | |
|---|---|---|---|
| 4,045,749 | 8/1977 | Burnham et al. | 372/96 |
| 4,416,012 | 11/1983 | Botez et al. | 372/45 |
| 4,480,331 | 10/1984 | Thompson | 372/45 |
| 4,573,161 | 2/1986 | Sakai et al. | 372/45 |
| 4,635,268 | 1/1987 | Motegi et al. | 372/45 |
| 4,745,612 | 5/1988 | Hayakawa et al. | 372/45 |
| 4,757,510 | 7/1988 | Kaneno et al. | 372/45 |

FOREIGN PATENT DOCUMENTS 0210616 2/1987 European Pat. Off. .

Primary Examiner—James W. Davie
Attorney, Agent, or Firm—Irell & Manella

[57] ABSTRACT

A semiconductor laser device comprises a laminated crystal structure which includes a $Ga_{1-y}Al_yAs$ optical guiding layer and a $Ga_{1-z}Al_zAs$ ($z>y$) cladding layer in this sequence, the cladding layer is formed on both a $Ga_{1-x}Al_xAs$ ($0 \leq x \leq 0.1$ and $x<y$) layer and the optical guiding layer. The AlAs mole fraction y of the optical guiding layer is greater than 0.1.

6 Claims, 5 Drawing Sheets

SEMICONDUCTOR LASER DEVICE HAVING A GRATING STRUCTURE

BACKGROUND OF THE INVENTION

1. Field of the Invention:

This invention relates to a semiconductor laser device, more particularly to a GaAlAs/GaAs distributed feedback semiconductor laser device or distributed Bragg reflector semiconductor laser device.

2. Description of the prior art:

A GaAlAs/GaAs semiconductor laser device having a GaAs substrate and a heterojunction structure oscillates a laser beam at a wavelength of about 700 to 900 nm, and, therefore, is adequate as a light source for optical fiber communication, optical information processing, or optical measurement. Among semiconductor laser devices of such a kind, a distributed feedback (DFB) semiconductor laser device and distributed Bragg reflector (DBR) semiconductor laser device in which a periodical convexo-convex structure (diffraction grating) in formed in the vicinity of the active region have been intensively researched, because these laser devices oscillate at a single wavelength even when being modulated.

A process of manufacturing an example of such semiconductor laser devices will be described. FIG. 7 illustrates diagrammatically a prior art DFB semiconductor laser device. On a p-GaAs substrate 81, an n-GaAs current blocking layer 82 having a thickness of 0.8 μm is formed by a liquid phase epitaxial growth method (LPE), metal organic chemical vapor deposition method (MOCVD), or the like. Then, using a photolithography technique and a chemical etching technique, a V-shaped groove 83 which reaches the p-GaAs substrate 81 is formed in the n-GaAs current blocking layer 82. The V-shaped groove 83 functions as a current path and forms an optical waveguide. Thereafter, a second LPE is conducted to form sequentially a p-$Ga_{0.65}Al_{0.35}As$ cladding layer 84, a p-(or n-)GaAs active layer 85 having a thickness of 0.08 μm, and an n-$Ga_{0.93}Al_{0.07}As$ optical guiding layer 86 having a thickness of 0.3 μm. The thickness of the p-cladding layer 84 on the groove 83 is 1.2 μm.

Then, a diffraction grating G is formed on the n-$Ga_{0.93}Al_{0.07}As$ optical guiding layer 86. An n-$Ga_{0.65}Al_{0.35}As$ cladding layer 87 having a thickness of 1 μm and an n-GaAs capping layer 88 having a thickness of 2 μm are sequentially formed on the diffraction grating G by an LPE, thereby forming a laminated crystal structure of a double heterojunction type for laser oscillation.

The band gap of the optical guiding layer 86 is greater than that of the active layer 85 so that light propagates in both the active layer 85 and optical guiding layer 86, while the injected carriers are confined in the active layer 85. Such a structure is called an LOC (Large Optical Cavity) structure.

A prior art GaAlAs/GaAs DFB laser device having such a structure has a drawback which will be described. Since the GaAlAs optical guiding layer 86 on which the diffraction grating G is formed is easily oxidized, a stable oxide layer containing aluminum is formed on the surface of the optical guiding layer 86 in the step of the formation of the diffraction grating G is conducted. In the succeeding epitaxial growth (e.g., LPE or MBE), therefore, it is impossible to grow a uniform and highly crystallized GaAlAs layer. When an epitaxial growth is to be conducted on the diffraction grating G, hence, the AlAs mole fraction of the optical guiding layer 86 should be less than about 0.1 so that the layer 86 will not be easily oxidized. In a GaAlAs/GaAs laser device with an optical guiding layer having such a low AlAs mole fraction, the injected carriers cannot be confined in the active layer 85 unless the active layer 85 consists of GaAs. A laser device having a GaAs active layer oscillates a laser beam at a long oscillation wavelength (e.g., 870 nm). Therefore, it has been impossible to manufacture a GaAlAs/GaAs DFB or DBR laser device of shorter oscillation wavelength.

SUMMARY OF THE INVENTION

A semiconductor laser device of this invention, which overcomes the above-discussed and numerous other disadvantages and deficiencies of the prior art, comprises a laminated crystal structure which includes a $Ga_{1-y}Al_yAs$ optical guiding layer and a $Ga_{1-z}Al_zAs$ (z>y) cladding layer in this sequence, the improvement exists in that said $Ga_{1-z}Al_zAs$ (z>y) cladding layer is formed on both a $Ga_{1-x}Al_xAs$ (0≦x≦0.1 and x<y) layer and said $Ga_{1-y}Al_yAs$ optical guiding layer.

In a preferred embodiment, the diffraction grating is formed on said $Ga_{1-y}Al_yAs$ optical guiding layer.

In a preferred embodiment, the diffraction grating is formed partially on said $Ga_{1-y}Al_yAs$ optical guiding layer.

In a preferred embodiment, the $Ga_{1-x}Al_xAs$ layer is formed on at least one of the side portions of said $Ga_{1-y}Al_yAs$ optical guiding layer.

In a preferred embodiment, the $Ga_{1-x}Al_xAs$ layer is formed at least one of the lateral sides of said $Ga_{1-y}Al_yAs$ optical guiding layer.

In a preferred embodiment, the $Ga_{1-y}Al_yAs$ optical guiding layer is formed in a laminated semiconductor crystal structure formed on a $Ga_{1-x}Al_xAs$ substrate, and said $Ga_{1-x}Al_xAs$ substrate functions as said $Ga_{1-x}Al_xAs$ layer.

Thus, the invention described herein makes possible objectives of (1) providing a novel structure of a GaAlAs/GaAs semiconductor laser device in which a uniformly crystallized cladding can be formed on an optical guiding layer having a large AlAs mole fraction; (2) providing a GaAlAS/GaAs DFB or DBR semiconductor laser device in which the diffraction grating is formed on a GaAlAs optical guiding layer having a large AlAs mole fraction; and (3) providing a GaAlAS/GaAs DBR or DBR semiconductor laser device which oscillates a laser beam of the 700 nm band.

In the laser device according to the invention, it is most preferable that the $Ga_{1-x}Al_xAs$ layer is a GaAs layer (i.e., x=0). However, the advantageous effect of the invention can be achieved as far as that the AlAs mole fraction x is within the range from 0 to 0.1 (including 0 and 0.1). When the AlAs mole fraction x is greater than 0.1, the $Ga_{1-x}Al_xAs$ layer is liable to be easily oxidized.

According to the invention, the epitaxial growth of the $Ga_{1-z}Al_zAs$ cladding layer can be conducted satisfactorily even when the AlAs mole fraction y of the $Ga_{1-y}Al_yAs$ optical guiding layer is greater than 0.1, because the interface on which the surface of the $Ga_{1-x}Al_xAs$ layer and the surface of the $Ga_{1-y}Al_yAs$ optical guiding layer (on which the diffraction grating is formed). When, in an epitaxial growth apparatus, a Ga melt containing supersaturated As and predetermined quantities of Al and an impurity is in contact with both the $Ga_{1-x}Al_xAs$ layer and the $Ga_{1-y}Al_yAs$ optical guiding layer, the epitaxial growth of the $Ga_{1-z}Al_zAs$ cladding layer starts on the $Ga_{1-x}Al_xAs$ layer which is less oxidizable, and then the epitaxial growth in the lateral direction starts on the upper end surfaces of the $Ga_{1-y}Al_yAs$ optical guiding layer. Finally, the epitaxial growth of the cladding layer is conducted over the whole area of the surface of the $Ga_{1-y}Al_yAs$ optical guiding layer.

According to the invention, the epitaxial growth of the cladding layer can be performed on an optical guiding layer having a large AlAs mole fraction because the interface on which the cladding layer is grown is formed by both a $Ga_{1-y}Al_yAs$ optical guiding layer (on which the diffraction grating is formed) and a layer which is less liable to be oxidized and on which the epitaxial growth can be easily performed

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

(First Example)

Figure 1:
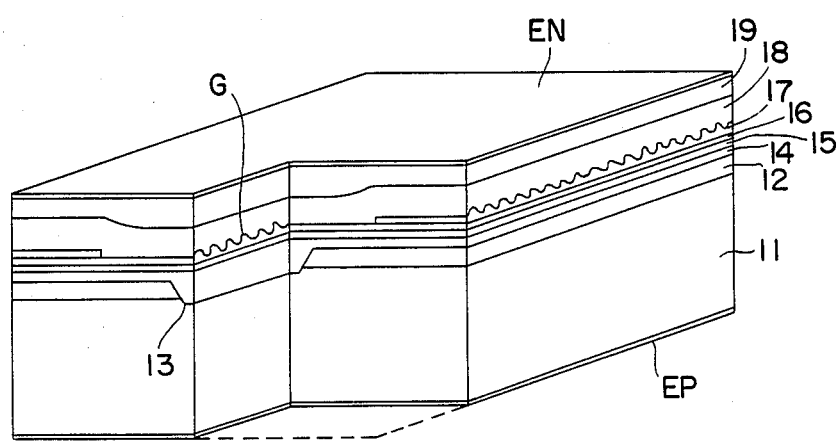
FIG. 1 shows diagrammatically one example of the DFB laser device according to the invention.

FIG. 1 shows diagrammatically one example of the DFB laser device according to the invention. The structure of the device of FIG. 1 will be illustrated by way of describing a manufacturing process of the device. On a p-GaAs substrate 11, an n-GaAs current blocking layer 12 (thickness: 1 $\mu$m) is formed by an LPE. Then, a striped groove 13 having a width of 4 $\mu$m is formed so that the groove 13 penetrates the current blocking layer 12 to reach the substrate 11. The striped groove 13 functions as a current path and forms an optical waveguide. Thereafter, a second LPE is conducted to form sequentially a p-$Ga_{0.5}Al_{0.5}As$ cladding layer 14, a p-$Ga_{0.86}Al_{0.14}As$ active layer 15 having a thickness of 0.06 $\mu$m, an n-$Ga_{0.7}Al_{0.3}As$ optical guiding layer 16 having a thickness of 0.15 $\mu$m, and an n-$Ga_{1-x}Al_xAs$ auxiliary layer 17 having a thickness of 0.2 $\mu$m. The thickness of the p-cladding layer 14 on the groove 13 is 1.4 $\mu$m. The AlAs mole fraction x of the auxiliary layer 17 may range from 0 to 0.1 ($0 \leq x \leq 0.1$). In this example, the auxiliary layer 17 is a GaAs layer (i.e., $x=0$).

The stripe portion (width: 100 $\mu$m) of the GaAs auxiliary layer 17 above the groove 13 is selectively etched away by a chemical etching technique. A secondary diffraction grating G (period: 2300 Å) is formed on both the $Ga_{0.7}Al_{0.3}As$ optical guiding layer 16 and the n-GaAs auxiliary layer 17 by a two-beam interference exposing method and a chemical etching technique.

Thereafter, an n-$Ga_{0.5}Al_{0.5}As$ cladding layer 18 having a thickness of 1.5 $\mu$m and an n-GaAs capping layer 19 having a thickness of 1 $\mu$m are grown by an LPE. An n-side electrode EN and a p-side electrode EP are formed. Then, the wafer is cleaved to form a device having a resonator length of 250 $\mu$m. Each of the cleaved facets is coated by an $Al_2O_3$ film the thickness of which is $\lambda/4$ (wherein $\lambda$ is a oscillation wavelength) so that the reflectivity of the facets is set to 2% to suppress the Fabry-Pérot oscillation mode.

The DFB laser device thus obtained generates a laser beam of 780 nm at a threshold current level of about 50 mA. Further, this visible-light DFB laser device oscillates at a same longitudinal mode in the temperature range from $-10°$ C. to $60°$ C., resulting in providing a stable single longitudinal mode laser oscillation.

(Second Example)

Figure 2:
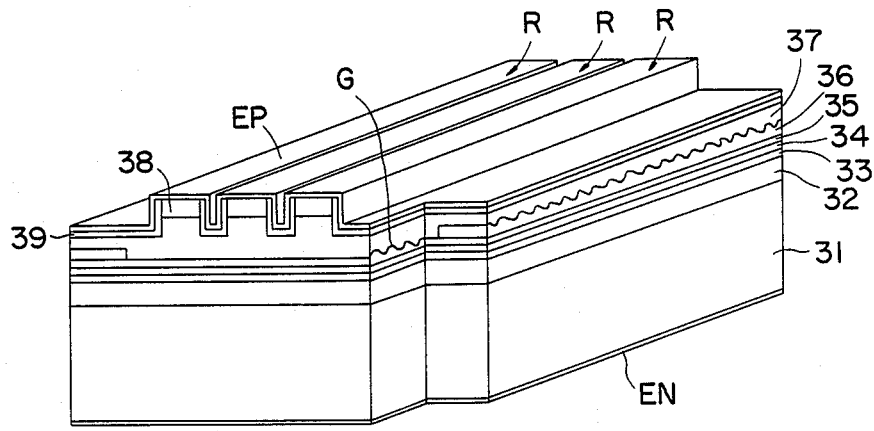
FIG. 2 shows diagrammatically one example of the DFB laser array device according to the invention.

FIG. 2 illustrates diagrammatically one example of the DFB laser array device according to the invention. On an n-GaAs substrate 31, an n-$Ga_{0.5}Al_{0.5}As$ cladding layer 32 (thickness: 1.2 $\mu$m), an n-$Ga_{0.7}Al_{0.3}As$ optical guiding layer 33 (thickness: 0.15 $\mu$m), an n-$Ga_{0.86}Al_{0.14}As$ active layer 34 (thickness: 0.06 $\mu$m), a p-$Ga_{0.7}Al_{0.3}As$ optical guiding layer 35 (thickness: 0.15 $\mu$m), and a p-GaAs auxiliary layer 36 (thickness: 0.2 $\mu$m) are sequentially formed by an LPE. The central portion of the p-GaAs auxiliary layer 36 is selectively removed to expose the central portion of the optical guiding layer 35. A diffraction grating G is formed on the exposed surface of the optical guiding layer 35 and p-GaAs auxiliary layer 36. Thereafter, a p-$Ga_{0.5}Al_{0.5}As$ cladding layer 37 (thickness: 1.2 $\mu$m) and a p-GaAs capping layer 38. (thickness: 1 $\mu$m) are grown by an LPE. The cladding layer 37 and capping layer 38 are selectively etched away to form three ridges R at a pitch of 5 $\mu$m. The ridges R have a width of 3 $\mu$m and a height of 1.9 $\mu$m. On the exposed surfaces of the cladding layer 37 and capping layer 38, an $Si_3N_4$ film 39 is formed. The portions of the $Si_3N_4$ film 39 which are on the ridges R are removed to form current paths. An n-side electrode EN and p-side electrode EP are formed. Then, the wafer is cleaved to form a device having a resonator length of 250 $\mu$m. Each of the cleaved facets is coated by an $Al_2O_3$ film (reflectivity: 2%).

The resulting DFB laser array device having three ridge type optical waveguides generates a laser of 780 nm of a single longitudinal mode at a threshold current level of about 90 mA.

(Third Example)

Figure 3:
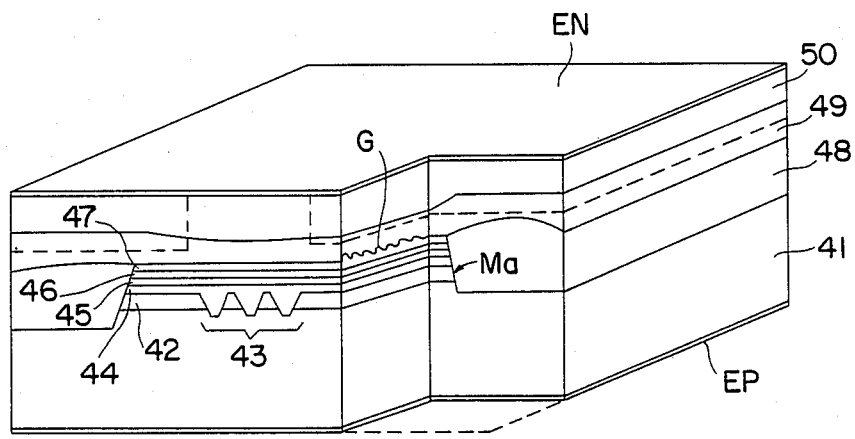
FIG. 3 shows diagrammatically another example of the DFB laser array device according to the invention.

FIG. 3 illustrates diagrammatically another example of the DFB laser array device according to the invention. On a p-GaAs substrate 41, an n-GaAs current blocking layer 42 having a thickness of 1 $\mu$m is grown by an LPE. Then, three striped grooves 43 (width: 4 $\mu$m) are formed at a pitch of 5 $\mu$m so that the grooves 43 penetrate the current blocking layer 42 to reach the substrate 41. The striped grooves 43 function as current paths and form optical waveguides. The grooves 43 are not restricted to the parallel V-shaped ones as shown in FIG. 3, but can be formed into any other suitable arrangement. For example, the grooves 43 may be constructed into branching optical waveguides which are smoothly coupled to each other.

Thereafter, a second LPE growth is conducted to form a p-$Ga_{0.5}Al_{0.5}As$ cladding layer 44 (thickness: 1.4

μm on the grooves 43), a p-$Ga_{0.86}Al_{0.14}As$ active layer 45 (thickness: 0.06 μm), an n-$Ga_{0.6}Al_{0.4}As$ current barrier layer 46 (thickness; 0.1 μm), and an n-$Ga_{0.7}Al_{0.3}As$ Optical guiding layer 47 (thickness: 0.3 μm). A diffraction grating G is formed on the n-$Ga_{0.7}AL_{0.3}As$ optical guiding layer 47. Then, the both side portions of the laminated structure are etched away to form a stripe mesa Ma which projects from the substrate 41 and in which the grooves 43 are incorporated. In another embodiment, the mesa Ma may project from the current blocking layer 42 to utilize the current confining effect of the current blocking layer 42. A p-$Ga_{0.9}Al_{0.1}As$ auxiliary layer 48 is grown by an LPE to bury the both sides of the mesa Ma. The p-$Ga_{0.9}Al_{0.1}As$ auxiliary layer 48 can be selectively grown by adequately setting the degree of supersaturation of As in the Ga melt. The optimum degree of supersaturation depends on the area in which the selective growth is conducted. On the optical guiding layer 47 and the auxiliary layer 48, an n-$Ga_{0.5}Al_{0.5}As$ cladding layer 49 and an n-GaAs capping layer 50 are formed. Protons are injected into the portions of the n-GaAs capping layer 50 and n-$Ga_{0.5}Al_{0.5}As$ cladding layer 49 excluding the portion which positions over the grooves 43, to make the portions into high-resistance regions, thereby confining the current path. Thereafter, electrodes EP and EN are formed, and antireflection coatings are formed on the cleaved facets.

The resulting DFB laser array device having a resonator length of 250 μm generates a laser of 780 nm at a threshold current level of about 80 mA. This laser device oscillates at a single longitudinal mode up to an optical output of 100 mW, and at a same longitudinal mode over a temperature variation of about 50° C.

(Fourth Example)

Figure 4:
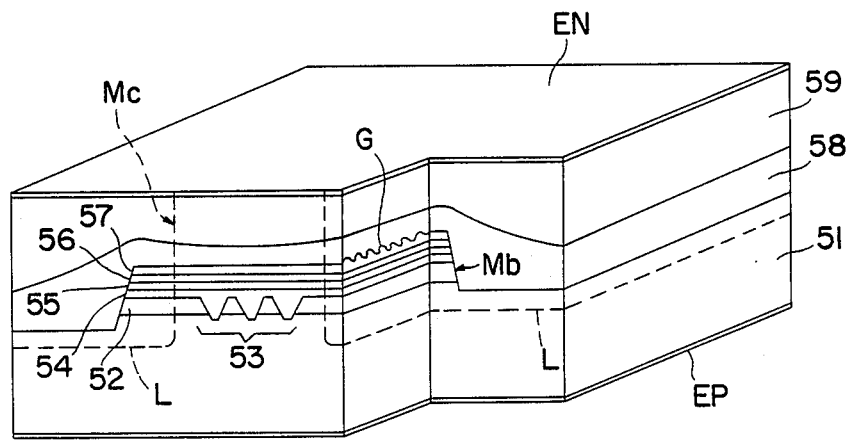
FIG. 4 shows diagrammatically a further example of the DFB laser array device according to the invention.

FIG. 4 illustrates diagrammatically a further example of the DFB laser array device according to the invention. On a p-GaAs substrate 51, an n-GaAs current blocking layer 52 having a thickness of 1 μm is grown by an LPE. Then, three striped grooves 53 (width: 4 μm) are formed at a pitch of 5 μm so that the grooves 53 penetrate the current blocking layer 52 to reach the substrate 51. The striped grooves 53 function as current paths and form optical waveguides. Then, a second LPE growth is conducted to form a p-$Ga_{0.5}Al_{0.5}As$ cladding layer 54 (thickness: 1.4 μm on the grooves 53), a p-$Ga_{0.86}Al_{0.14}As$ active layer 55 (thickness: 0.06 μm), an n-$Ga_{0.6}Al_{0.4}As$ current barrier layer 56 (thickness: 0.1 μm), and an n-$Ga_{0.7}Al_{0.3}As$ optical guiding layer 57 (thickness: 0.3 μm). A diffraction grating G is formed on the n-$Ga_{0.7}Al_{0.3}As$ optical guiding layer 57. Then, the both side portions of the laminated structure are etched away to form a stripe mesa Mb which projects from the substrate 51 and in which the grooves 53 are incorporated. On the optical guiding layer 57 and the substrate 51, an n-$Ga_{0.5}Al_{0.5}As$ cladding layer 58 and an n-GaAs capping layer 59 are grown by an LPE in which the degree of supersaturation of As in the Ga melt is set high. In the epitaxial growth of the cladding layer 58, the substrate 51 performs the same function as the auxiliary layers employed in other examples (e.g., the auxiliary layer 48 of the third example shown in FIG. 3). An n-GaAs capping layer 59 is formed on the cladding layer 58. After forming the electrodes EP and EN, the portions enclosed by the dotted lines L are removed by a chemical etching technique, to form another mesa structure Mc for laser oscillation, thereby confining the current path.

The resulting DFB laser array device exhibits similar oscillation characteristics as those of the laser array device shown in FIG. 3.

(Fifth Example)

Figure 5:
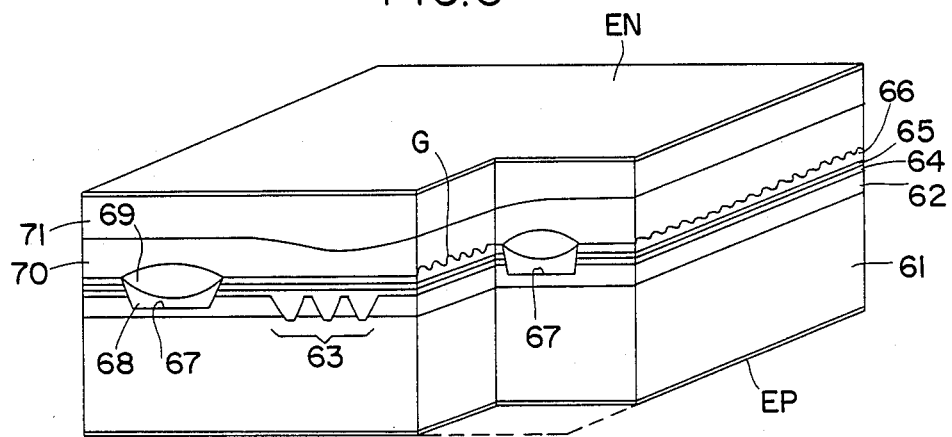
FIG. 5 shows diagrammatically a further example of the DFB laser array device according to the invention.

FIG. 5 illustrates diagrammatically a further example of the DVB laser array device according to the invention. On a p-GaAs substrate 61, an n-GaAs current blocking layer 62 having a thickness of 1 μm is grown by an LPE. Then, three striped grooves 63 (width: 4 μm) are formed at a pitch of 5 μm so that the grooves 63 penetrate the current blocking layer 62 to reach the substrate 61. Then, a second LPE growth is conducted to form a p-$Ga_{0.5}Al_{0.5}As$ cladding layer 64 (thickness: 1.4 μm on the grooves 63), a p-$Ga_{0.86}Al_{0.14}As$ active layer 65 (thickness: 0.06 μm), and an n-$Ga_{0.7}Al_{0.3}As$ optical guiding layer 66 (thickness: 0.3 μm). A diffraction grating G is formed on the n-$Ga_{0.7}Al_{0.3}As$ optical guiding layer 66. Then, two parallel grooves 67 (width: about 30 μm) which reach the n-GaAs current blocking layer 62 are formed along the grooves 63. An n-$Ga_{0.5}Al_{0.5}As$ layer 68 and a p-GaAs (or p-$Ga_{0.9}Al_{0.1}As$) auxiliary layer 69 are selectively grown by an LPE in each of the grooves 67. This selective epitaxial growth can be conducted by adequately setting the degree of supersaturation of the Ga melt. On the optical guiding layer 66 and the auxiliary layer 69, an n-$Ga_{0.5}Al_{0.5}As$ cladding layer 70 and an n-GaAs capping layer 71 are formed. Thereafter, electrodes EP and EN are formed, and antireflection coatings are formed on the cleaved facets.

The resulting DFB laser array device exhibits substantially similar oscillation characteristics as those of the laser array device (the third example) shown in FIG. 3.

(Sixth Example)

Figure 6:
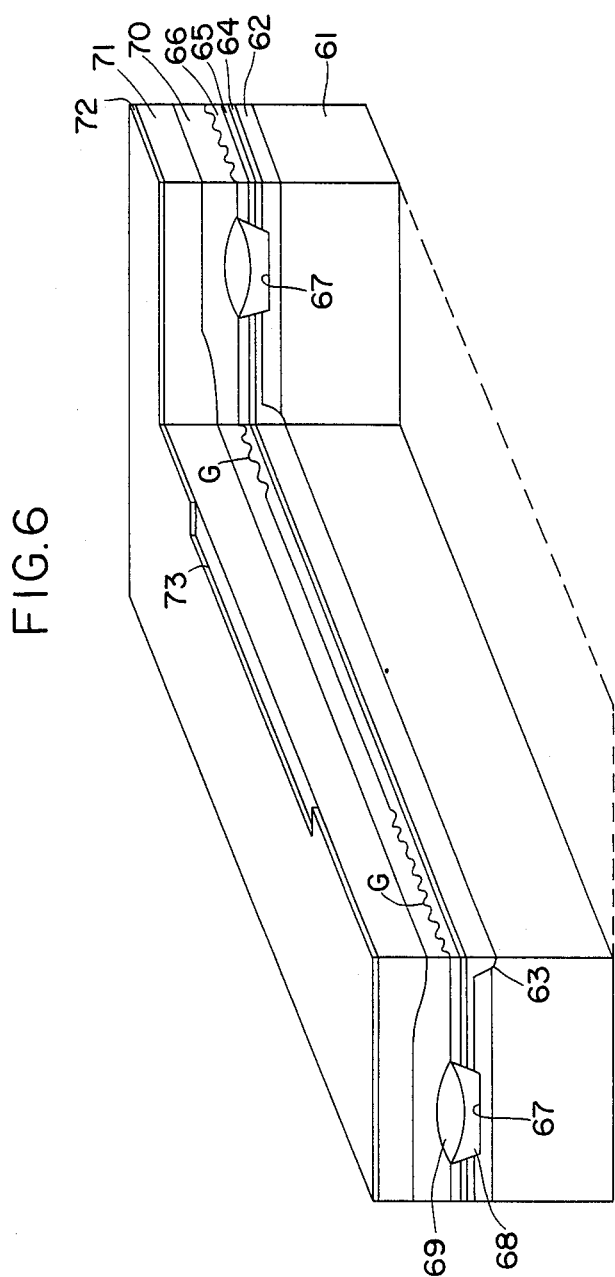
FIG. 6 shows diagrammatically an example of the DBR laser device according to the invention.
Figure 7:
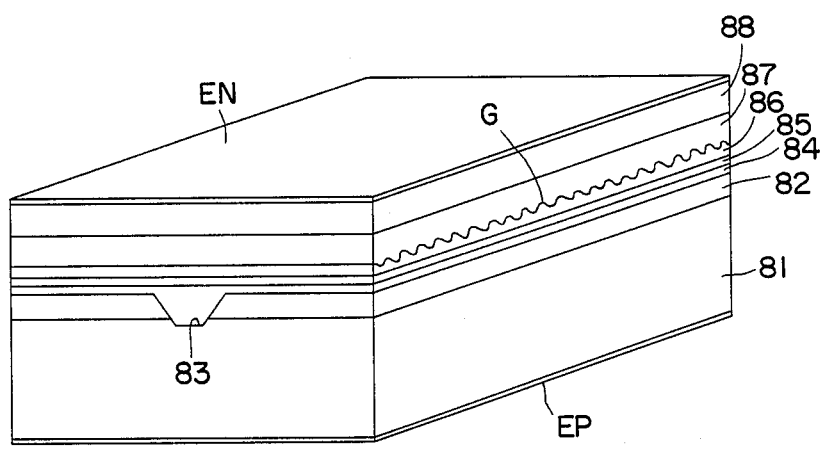
FIG. 7 shows diagrammatically a prior art DFB semiconductor laser device.

FIG. 6 illustrates diagrammatically an example of the DBR laser device according to the invention. In the same manner as described in the fifth example, on a p-GaAs substrate 61, an n-GaAs current blocking layer 62, a striped groove 63, a p-$Ga_{0.5}Al_{0.5}As$ cladding layer 64, a p-$Ga_{0.86}Al_{0.14}As$ active layer 65, and an n-$Ga_{0.7}Al_{0.3}As$ optical guiding layer 66 are sequentially formed by an LPE. Then, in the regions of the surface of the optical guiding layer 66 which correspond to the end portions in the vicinity of facets of the resulting laser device, diffraction gratings G are formed. An n-$Ga_{0.5}Al_{0.5}As$ layer 68 and a p-GaAs (or p-$Ga_{0.9}Al_{0.1}As$) auxiliary layer 69 are selectively grown by an LPE in each of the grooves 67. On the optical guiding layer 66 and the auxiliary layer 69, an n-$Ga_{0.5}Al_{0.5}As$ cladding layer 70 and an n-GaAs capping layer 71 are formed. An insulating film 72 composed of $Si_3N_4$ is formed on the n-GaAs capping layer 71. The center portion of the $Si_3N_4$ film 72 which positions above the gain region of the DBR laser device (i.e., the region of the optical guiding layer 66 on which no diffraction grating is formed) is removed to form a rectangular current injection hole 73. Thereafter, the formation of electrodes, the cleavage and the formation of antireflection coatings on the cleaved facets are conducted to obtain a DBR laser device. It should be noted that the electrodes are not shown in FIG. 6.

When setting the width of the groove 63 to 4 μm, the length of the gain region to 200 μm, and the length of the end portions (in which the diffraction gratings G are formed) to 50 μm, the DBR laser device generates a single longitudinal mode laser oscillation of 780 nm at a threshold current level of 60 mA. It was confirmed that this laser device oscillates stably at a same longitudinal mode over a wide range of the external temperature variation.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would treated as equivalents thereof by those skilled in the art to which this invention pertains.

What is claimed is:

1. In a semiconductor laser device comprising a laminated crystal structure which includes a $Ga_{1-y}Al_yAs$ optical guiding layer and a $Ga_{1-z}Al_zAs$ ($z>y$) cladding layer in this sequence, the improvement exists in that said $Ga_{1-z}Al_zAs$ ($z>y$) cladding layer is formed directly on both a $Ga_{1-x}Al_xAs$ ($0 \leq x \leq 0.1$ and $x<y$) layer and said $Ga_{1-y}Al_yAs$ optical guiding layer.

2. A semiconductor laser device according to claim 1, wherein a diffraction grating is formed on said $Ga_{1-y}Al_yAs$ optical guiding layer.

3. A semiconductor layer device according to claim 1, wherein a diffraction grating is formed partially on said $Ga_{1-y}Al_yAs$ optical guiding layer.

4. A semiconductor laser device according to claim 1, wherein said $Ga_{1-x}Al_xAs$ layer is formed on at least one of the side portions of said $Ga_{1-y}Al_yAs$ optical guiding layer.

5. A semiconductor laser device according to claim 1, wherein said $Ga_{1-x}Al_xAs$ layer is formed at least one of the lateral sides of said $Ga_{1-y}Al_yAs$ optical guiding layer.

6. A semiconductor laser device according to claim 1, wherein said $Ga_{1-y}Al_yAs$ optical guiding layer is formed in a laminated semiconductor crystal structure formed on a $Ga_{1-x}Al_xAs$ substrate, and said $Ga_{1-x}Al_xAs$ substrate functions as said $Ga_{1-x}Al_xAs$ layer.

* * * * *